United States Patent
Pollino et al.

(10) Patent No.: US 12,473,254 B2
(45) Date of Patent: Nov. 18, 2025

(54) PHOTOCURABLE POLYMER COMPOSITIONS

(71) Applicants: SOLVAY SPECIALTY POLYMERS USA, LLC, Alpharetta, GA (US); VIRGINIA TECH INTELLECTUAL PROPERTIES, INC., Blacksburg, VA (US)

(72) Inventors: Joel Pollino, Johns Creek, GA (US); Kermit S. Kwan, Cumming, GA (US); Timothy Long, Blacksburg, VA (US); Christopher Williams, Blacksburg, VA (US); Viswanath Meenakshisundaram, Blacksburg, VA (US); Cody Weyhrich, Christiansburg, VA (US)

(73) Assignees: VIRGINIA TECH INTELLECTUAL PROPERTIES, INC., Blacksburg, VA (US); SOLVAY SPECIALTY POLYMERS USA, LLC, Alpharetta, GA (US)

( * ) Notice: Subject to any disclaimer, the term of this patent is extended or adjusted under 35 U.S.C. 154(b) by 353 days.

(21) Appl. No.: 17/995,834

(22) PCT Filed: Apr. 8, 2021

(86) PCT No.: PCT/EP2021/059214
§ 371 (c)(1),
(2) Date: Oct. 7, 2022

(87) PCT Pub. No.: WO2021/204961
PCT Pub. Date: Oct. 14, 2021

(65) Prior Publication Data
US 2023/0150930 A1 May 18, 2023

Related U.S. Application Data

(60) Provisional application No. 63/007,454, filed on Apr. 9, 2020.

(30) Foreign Application Priority Data

Jul. 14, 2020 (EP) .................................... 20185769

(51) Int. Cl.
*B33Y 10/00* (2015.01)
*C07C 317/24* (2006.01)
*G03F 7/00* (2006.01)
*G03F 7/20* (2006.01)

(52) U.S. Cl.
CPC ............ *C07C 317/24* (2013.01); *B33Y 10/00* (2014.12); *G03F 7/0037* (2013.01); *G03F 7/2002* (2013.01)

(58) Field of Classification Search
CPC ... B29C 64/135; G03F 7/2002; G03F 7/0037; C08G 75/23; B33Y 40/20; B33Y 70/00; B33Y 10/00; C07C 317/24
See application file for complete search history.

(56) References Cited

U.S. PATENT DOCUMENTS 5,965,663 A    10/1999   Hayase

FOREIGN PATENT DOCUMENTS

| EP | 106023 A2 | 4/1984 |
| WO | 2019129595 A1 | 7/2019 |
| WO | 2020074332 A1 | 4/2020 |

OTHER PUBLICATIONS

Farrukh, M. M. et al. "Solvent-stable UV-cured acrylic polysulfone membranes", Polym. Int., Sep. 13, 2016, vol. 66, pp. 64-69—Society of Chemical Industry (6 pages).
Sangermano, M. et al. "Synthesis, preparation and characterization of UV-cured methacrylated polysulfone-based membranes", Materials Today Communications, Dec. 1, 2015, vol. 5, pp. 64-69, DOI: 10.1016/j.mtcomm.2015.10.002—Elsevier Ltd. (6 pages).
Struzynska-Piron, I. et al. "Influence of UV curing on morphology and performance of polysulfone membranes containing acrylates", Journal of Membrane Science, 2014, vol. 462, pp. 17-27—Elsevier B.V. (11 pages).
International Search Report issued in Internaitonal Application No. PCT/EP2021/059214 dated Jul. 7, 2021 (4 pages).
Written Opinion issued in Internaitonal Application No. PCT/EP2021/059214 dated Jul. 7, 2021 (5 pages).

*Primary Examiner* — Monica A Huson
(74) *Attorney, Agent, or Firm* — Osha Bergman Watanabe & Burton LLP

(57) ABSTRACT

The present invention relates to relates to a polymer formulation for three-dimensionally (3D) printing an article by stereolithography, the formulation comprising a functionalized polymer. The invention further relates to lithographic methods to form 3D objects that incorporate the aforementioned polymer formulation.

17 Claims, No Drawings

PHOTOCURABLE POLYMER COMPOSITIONS

RELATED APPLICATIONS

This application is a national stage entry under 35 U.S.C. § 371 of International Application No. PCT/EP2021/059214 filed Apr. 8, 2021, which claims priorities of U.S. provisional application 63/007,454 filed on Apr. 9, 2020, and of EP patent application Ser. No. 20/185,769.5 filed on Jul. 14, 2020. The entire contents of these applications are explicitly incorporated herein by this reference.

TECHNICAL FIELD

The present invention relates to a polymer formulation for three-dimensionally (3D) printing an article by stereolithography, the formulation comprising a functionalized polymer and a cross-linker. The invention further relates to lithographic methods to form 3D objects that incorporate the aforementioned polymer formulations.

BACKGROUND ART

Polymer compositions are commonly used to manufacture articles for the automotive and aerospace industries, for example as engine parts, as well as in the healthcare industry, for example as implantable devices and dental prostheses. These articles have to present good mechanical properties after fabrication, but they also have to retain a sufficient percentage of these properties over time, notably at their temperature of use (sometimes higher than 150° C.).

Lithographic processes for the photofabrication of 3D articles from polymeric materials have found recent popularity due to their relative speed and simplicity. In general, lithographic processes involve the use of light, for example UV irradiation, to locally cure a polymerizable formulation at specific locations. The localized curing allows for the fabrication of 3-dimensional articles.

Lithographic processes generally use polymerizable formulations that are liquid in order to obtain parts with a good resolution. Polymerizable formulations that are liquid at room temperature are easier to use in a printing process, but they generally lead to articles having moderate mechanical properties and thermal stability.

The polymeric materials used in lithographic processes need to be in a liquid state under printing conditions. For certain polymeric materials, such as high performance polymers, this implies that they need to be heated above their glass transition temperature (Tg) or above their melting temperature (Tm). They also need to possess functional groups that are photo-polymerizable or cross-linkable, that-is-to-say reactive during the printing process when irradiating the layer of polymerizable formulation. One of the challenges in applying lithographic methods to high performance polymers is the need for the material to remain thermally stable at high temperatures while also avoiding thermal polymerization of a photo-polymerizable functional group.

Another challenge is the identification of effective photopolymerizable groups and synthetic methods to add them to the material to be printed, so to render the polymeric material photo-polymerizable.

Another challenge in the identification of valuable polymerizable formulations to be used in lithographic processes is that they have to be capable of producing 3D articles that present good mechanical properties after photofabrication and substantially retain these mechanical properties after exposure to high temperature, for example above 150° C.

The polymerizable formulations of the present invention provide a well-suited solution for 3D printing processes, which can for example take place at room temperature or at a higher temperature.

WO2020/074332 A1 (Solvay) relates to polymer formulation (F) comprising a polymer of low molecular weight, comprising photo-polymerizable end-groups. Because of their low molecular weight, that-is-to-say their short chain lengths, the concentration of photo-polymerizable groups is high and these polymers show a good printability.

The article "Solvent-stable UV-cured acrylic polysulfone membranes" from Mehmood Mian Farrukh et al. (2016) relates to the effect of the presence of acrylate resin on polysulfone-based membranes, which are prepared via UV curing of the polymer dope followed by a non-solvent-induced phase separation process.

The article "Synthesis, preparation and characterization of UV-cured methacrylated polysulfone-based membranes" from M. Sangermano et al. (2015) relates to a two-step method involving non-solvent induced phase separation (NIPS) and a UV curing process for the preparation of networked-polysulfone membranes.

These two articles do not describe the poly(aryl ethersulfone) (PAES) polymer (P) of the present invention, nor the use of a polyfunctional photo-crosslinker, which creates a high molecular weight network with polymer (P) after printing and curing, due to the presence of photocurable groups on polymers (P).

The polymerizable formulations of the present invention provide a well-suited solution for high temperature 3D printing processes, and allow producing 3D printed articles from high molecular weight polymer formulations with low concentration of photo-polymerizable groups to achieve good printability and obtain 3D printed parts that possess good mechanical properties.

SUMMARY OF THE INVENTION

The present invention relates to a polymer formulation (F) comprising a polymer (P) which is a poly(aryl ether sulfone) (PAES) polymer comprising at least one photo-polymerizable terminal group, preferably two photo-polymerizable terminal groups, in combination with a polyfunctional photo-crosslinker.

This polymer formulation (F) can be for example used in photofabrication processes. In particular, the formulation (F) of the present invention can be incorporated into lithographic processes in which light is used to cure the functionalized polymers. The formulation (F) of the present invention can be turned into a liquid state at a temperature below or above the Tg of polymer (P) without noticeable change and then be cured by irradiation of UV light, producing high thermal properties materials having high Tg, high mechanical properties and high thermal stability. The formulation (F) of the invention can effectively be used in 3D printing lithographic processes.

The present invention also relates to a method for manufacturing a three-dimensional (3D) article with an additive manufacturing system, comprising:
  providing a polymer formulation (F) according to the invention, and
  printing layers of the 3D article from the polymer formulation (F).

According to another embodiment of the present invention, the step of printing comprises irradiating the polymer formulation (F) with UV or visible light. The UV light can for example be laser light.

The present invention also relates to 3D article obtainable, at least in part, by the method described above, and the use of the polymer formulation (F), for the manufacture of 3D objects by stereolithography (SLA).

DISCLOSURE OF THE INVENTION

The present invention relates to a formulation (F) comprising a PAES polymer (P), which can, for example, be used in lithographic processes for the photofabrication of three-dimensional (3D) articles.

Stereolithography is an additive manufacturing (AM) process that works by focusing light, for example an ultraviolet (UV) light or visible light, on a vat of cross-linkable photopolymer resin. Then complex 3D structures can be built in a layer-by-layer fashion.

The polymer (P) described herein, in combination with a cross-linker, can be 3D printed to manufacture articles, for example using the stereolithography technology (SLA), the ink-jet technology, direct ink writing (DIW) or digital light processing (DLP).

The present invention relates to a polymer formulation (F) comprising one poly(aryl ethersulfone) (PAES) polymer (P), wherein the polymer (P) has been functionalized. More precisely, the polymer (P) comprises at least one terminal group of formula (M1) or (M2):

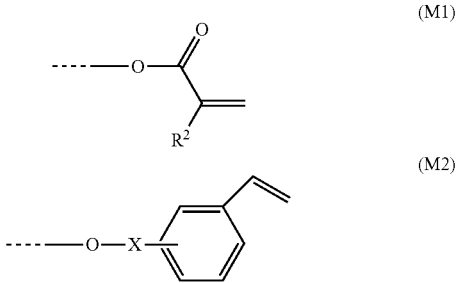

wherein
R$^2$ is H or CH$_3$,
X is a bond or (CH$_2$)$_n$ with n ranging from 1 to 20, for example from 1 to 10 or from 1 to 8, preferably being equal to 1 or 2.

The polymer (P) preferably comprises two terminal groups of formula (M1) or (M2), more preferably two terminal groups of formula (M1), even more preferably two terminal groups of formula (M1) where R$^2$ is H.

According to the present invention, the number average molecular weight (Mn) of the polymer (P) is at least 12,000 g/mol, at least 13,000 g/mol, at least 14,000 g/mol, at least 15,000 g/mol, at least 17,000 g/mol, or at least 20,000 g/mol, as determined by gel permeation chromatography (GPC) using methylene chloride as a mobile phase and polystyrene standards. Preferably, the number average molecular weight (Mn) of the polymer (P) is less than 50,000 g/mol, or less than 40,000 g/mol.

The formulation (F) comprising the functionalized polymer (P) of the invention can be used in photofabrication processes. In particular, the polymer (P) and polymer formulation (F) of the present invention can be incorporated into lithographic processes in which light is used to cure the functionalized polymers.

The cross-linking ability of the formulation of the present invention can be assessed by photorheology. The formulation (F) of the present invention transforms from a liquid to a solid upon printing, e.g. upon irradiating the formulation with light, for example UV light or visible light. The change can be measured by a rotational rheometer. The transition from liquid resin to solid manifests itself in an increase of the storage modulus G' and the loss modulus G". The crossover of G' and G" approximated the gel point, which signified the transformation of a liquid to a gel upon network formation. The gel point is a critical engineering parameter to achieve quality printed structures. The measurement of G' on the formulations allows the assessment of the stiffness of the printed part, and therefore their ability to support the next layer of printed resin. The crossover of G' and G" gives an indication of the crosslinking speed and the liquid-to-solid transition time.

In addition to the photo-polymerizable (or cross-linkable) polymer (P), the formulation (F) of the present invention also comprises:
at least one polyfunctional acrylate,
at least one solvent,
optionally at least one photoinitiator, and
optionally at least one blocker.

The formulation (F) of the present invention is preferably liquid. For example, the formulation (F) is liquid at room temperature or above.

The polyfunctional acrylate is added to a formulation (F) as a cross-linker, that-is-to-say to create a high molecular weight network with polymer (P) after printing and curing, due to the presence of photocurable groups on polymers (P).

According to the present invention, a photoinitiator is a compound especially added to a formulation to convert absorbed light energy, UV or visible light, into chemical energy in the form of initiating species, for example free radicals or cations.

According to the present invention, a blocker is a compound added to either scavenge unused radicals created by the photoinitiator or absorb a portion of the incident UV energy. This compound allows for improving dimensional accuracy of the fabricated part.

The polymer (P) described in the present invention is functionalized with a functional group, which is a (meth) acrylic moiety (M1) and/or a styrene (M2). The functional groups are introduced as a post-polymerization modification as a "terminal functionalization" on at least one end of the polymer chain, for example at both ends of the polymer chain.

The formulation (F) of the present invention can comprise more than one polymer (P), for example two or three distinct polymers (P).

Poly(aryl ether sulfone) (PAES)

P is preferably a PAES having recurring units (R$_{PAES}$) of formula (L):

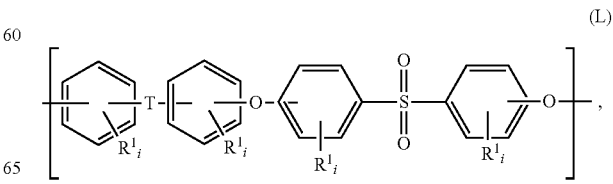

wherein
each $R^1$ is, independently for each aromatic cycle, selected from the group consisting of a halogen, alkyl, alkenyl, alkynyl, aryl, ether, thioether, carboxylic acid, ester, amide, imide, alkali or alkaline earth metal sulfonate, alkyl sulfonate, alkali or alkaline earth metal phosphonate, alkyl phosphonate, amine and quaternary ammonium;

each i is, independently for each aromatic cycle, zero or an integer from 1 to 4;

T is selected from the group consisting of a bond, —$CH_2$—; —O—; —$SO_2$—; —S—; C(O)—; —$C(CH_3)_2$—; —$C(CF_3)_2$—; —$C(=CCl_2)$—; —$C(CH_3)(CH_2CH_2COOH)$—; —N=N—;

$R_aC\equiv CR_b$—, where each $R_a$ and $R_b$, independently from each other, is a hydrogen, a C1-C12-alkyl group, a C1-C12-alkoxy group, a C6-C18-aryl group; —$(CH_2)_m$— and —$(CF_2)_m$— with m being an integer from 1 to 6; an aliphatic divalent group, linear or branched, of up to 6 carbon atoms; or a combination thereof.

In some embodiments, the polymer (P) of the present invention comprises:
at least recurring units ($R_{PAES}$) of formula (L):

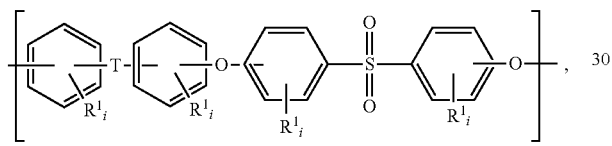

(L)

and
at least one terminal group of formula (M):

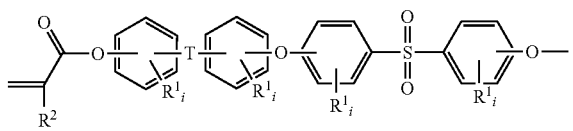

(M)

wherein:
each $R^1$ is, independently for each aromatic cycle, selected from the group consisting of a halogen, alkyl, alkenyl, alkynyl, aryl, ether, thioether, carboxylic acid, ester, amide, imide, alkali or alkaline earth metal sulfonate, alkyl sulfonate, alkali or alkaline earth metal phosphonate, alkyl phosphonate, amine and quaternary ammonium;

each i is, independently for each aromatic cycle, zero or an integer from 1 to 4;

T is selected from the group consisting of a bond, —$CH_2$—; —O—; —$SO_2$—; —C(O)—; —$C(CH_3)_2$—; —$C(CF_3)_2$—; —$C(=CCl_2)$—; —$C(CH_3)(CH_2CH_2COOH)$—; —N=N—;

—$R_aC=CR_b$—, where each $R_a$ and $R_b$, independently from each other, is a hydrogen, a C1-C12-alkyl group, a C1-C12-alkoxy group, a C6-C18-aryl group; —$(CH_2)_m$— and —$(CF_2)_m$— with m being an integer from 1 to 6; an aliphatic divalent group, linear or branched, of up to 6 carbon atoms; or a combination thereof and $R^2$ is H or $CH_3$.

In some embodiments, the recurring units ($R_{PAES}$) are according to formula (L'):

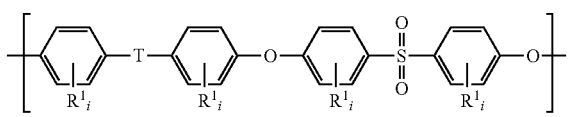

(L')

wherein $R^1$ and i are as above-mentioned.

In some embodiments, the terminal group(s) of the polymer (P) are according to formula (M'):

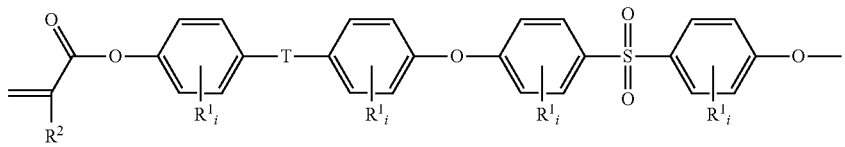

(M')

wherein $R^1$, $R^2$ and i are as above-mentioned.

According to an embodiment, i is zero for each $R^1$. In other words, according to this embodiment, the recurring units ($R_{PAES}$) are units of formula (L"):

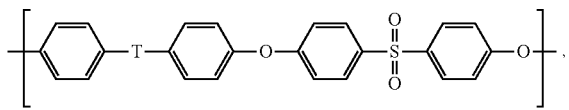

(L"), and the terminal group(s) of the polymer (P) are according to formula (M"):

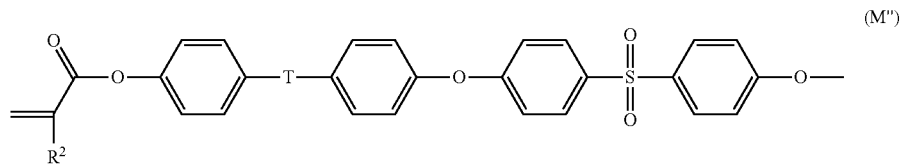

wherein T and R² are as above-mentioned.

In some embodiments, P is a PAES having at least 50 mol. % (based on the total number of moles in the polymer) of recurring units of formula (L), (L') or (L") and comprises at least one terminal group of formula (M), (M') or (M").

In some embodiments, at least 60 mol. %, at least 70 mol. %, at least 80 mol. %, at least 90 mol. %, at least 95 mol. %, at least 99 mol. % (based on the total number of moles in the polymer) or all of the recurring units in polymer (P) are recurring units ($R_{PAES}$) of formula (L), (L') or (L") and P comprises at least one at least one terminal group of formula (M), (M') or (M"), for example two terminal groups of formula (M), (M') or (M").

According to an embodiment of the present invention, P is a PAES wherein T is selected from the group consisting of a bond, —SO₂— and —C(CH₃)₂—.

According to another embodiment of the present invention, P is a PAES having at least 50 mol. % (based on the total number of moles in the polymer) of recurring units selected from the group consisting of formulas:

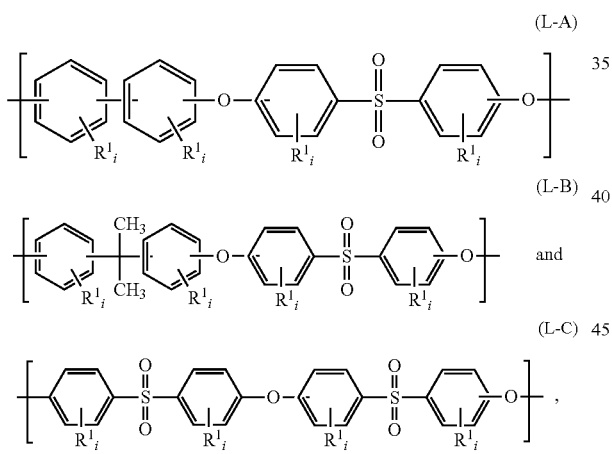

wherein R¹ and i are as above-mentioned.

According to this embodiment, at least 60 mol. %, at least 70 mol. %, at least 80 mol. %, at least 90 mol. %, at least 95 mol. %, at least 99 mol. % (based on the total number of moles in the polymer) or all of the recurring units in the polymer (P) are recurring units ($R_{PAES}$) of formula (L-A), formula (L-B) and/or formula (L-C) and P comprises at least one at least one terminal group of formula (M), (M') or (M"), for example two terminal groups of formula (M), (M') or (M").

According to an embodiment, P is a PAES wherein T is a bond. In other words, P is a functionalized poly(biphenyl ether sulfone) (PPSU).

According to an embodiment, P is a PPSU comprising:
at least 50 mol. % of the recurring units are recurring units ($R_{PPSU}$) of formula (L-A):

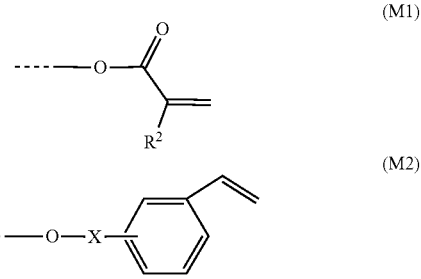

(the mol. % being based on the total number of moles in the polymer),
wherein R¹ and i are as above-mentioned, and
at least one terminal group of formula (M1) or (M2):

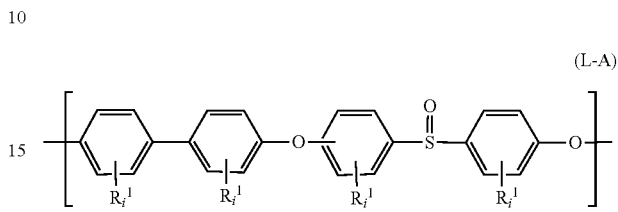

wherein
R² is H or CH₃,
X is a bond or $(CH_2)_n$ with n ranging from 1 to 20, for example from 1 to 10 or from 1 to 8, preferably being equal to 1 or 2.

The polymer (P) of the present invention can be a homopolymer or a copolymer. If it is a copolymer, it can be a random, alternate or block copolymer.

In some embodiments of the present invention, at least 60 mol. %, at least 70 mol. %, at least 80 mol. %, at least 90 mol. %, at least 95 mol. %, at least 99 mol. % or all of the recurring units in the polymer (P) are recurring units ($R_{PPSU}$) of formula (L-A) and P comprises at least one at least one terminal group of formula (M), (M') or (M"), for example two terminal groups of formula (M), (M') or (M").

When the polymer (P) is a poly(biphenyl ether sulfone) (PPSU) copolymer, it can be made of recurring units ($R*_{PPSU}$), different from recurring units ($R_{PPSU}$), such as recurring units of formula (L-B) and/or formula (L-C), both above-described, and/or recurring units of formula (L-D):

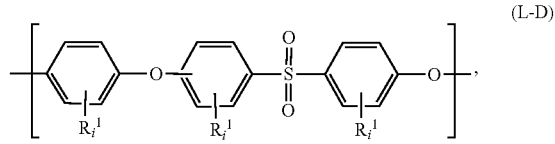

wherein R¹ and i are as above-mentioned.

The poly(biphenyl ether sulfone) (PPSU) polymer can be prepared by any method known in the art. It can for example result from the condensation of 4,4'-dihydroxybiphenyl (biphenol) and 4,4'-dichlorodiphenyl sulfone in presence of a base. The reaction of monomer units takes place through nucleophilic aromatic substitution with the elimination of one unit of hydrogen halide as leaving group. It is to be noted however that the structure of the resulting poly(biphenyl ether sulfone) does not depend on the nature of the leaving group. The PPSU is then modified after polymerisation to introduce the functional group at at least one end of the polymer chain. The functional group is an acrylate, an alkylacrylate or a styrene.

According to an embodiment, P is a PAES wherein T is —C(CH$_3$)$_2$—. In other words, P is a functionalized polysulfone (PSU).

According to an embodiment, P is a PSU comprising:
at least 50 mol. % of the recurring units are recurring units (R$_{PSU}$) of formula (L-B):

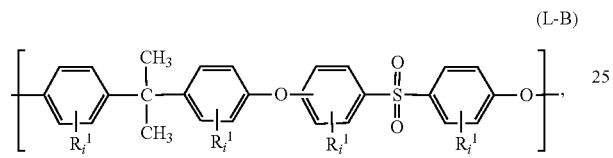

(L-B)

(the mol. % being based on the total number of moles in the polymer),
wherein R$^1$ and i are as above-mentioned, and
at least one terminal group of formula (M1) or (M2):

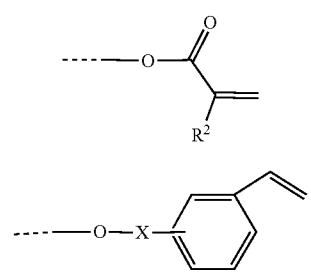

(M1)

(M2)

wherein
R$^2$ is H or CH$_3$,
X is a bond or (CH$_2$)$_n$ with n ranging from 1 to 20, for example from 1 to 10 or from 1 to 8, preferably being equal to 1 or 2.

In some embodiments of the present invention, at least 60 mol. %, at least 70 mol. %, at least 80 mol. %, at least 90 mol. %, at least 95 mol. %, at least 99 mol. % or all of the recurring units in the polymer (P) are recurring units (R$_{PSU}$) of formula (L-B) and P comprises at least one at least one terminal group of formula (M), (M') or (M"), for example two terminal groups of formula (M), (M') or (M").

When the polymer (P) is a polysulfone (PSU) copolymer, it can be made of recurring units (R*$_{PSU}$), different from recurring units (R$_{PSU}$), such as recurring units of formula (L-A), (L-C) and/or (L-D), all above-described.

According to an embodiment, P is a PAES wherein T is —SO$_2$—. In other words, P is a functionalized polyethersulfone (PES).

According to an embodiment, P is a PES comprising:
at least 50 mol. % of the recurring units are recurring units (R$_{PES}$) of formula (L-C):

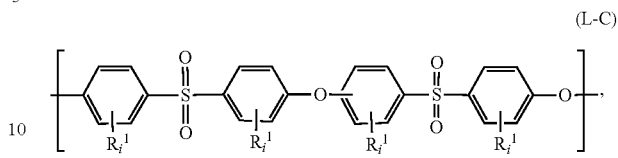

(L-C)

(the mol. % being based on the total number of moles in the polymer),
wherein R$^1$ and i are as above-mentioned, and
at least one terminal group of formula (M1) or (M2):

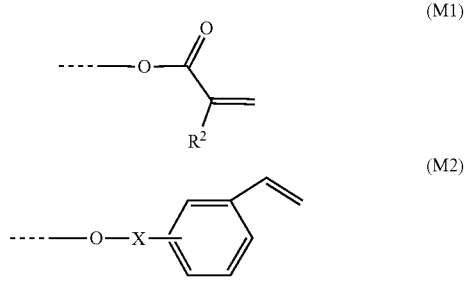

(M1)

(M2)

wherein
R$^2$ is H or CH$_3$,
X is a bond or (CH$_2$)$_n$ with n ranging from 1 to 20, for example from 1 to 10 or from 1 to 8, preferably being equal to 1 or 2.

According to an embodiment of the present invention, at least 60 mol. %, at least 70 mol. %, at least 80 mol. %, at least 90 mol. %, at least 95 mol. %, at least 99 mol. % or all of the recurring units in the polymer (P) are recurring units (R$_{PES}$) of formula (L-C) and P comprises at least one at least one terminal group of formula (M), (M') or (M"), for example two terminal groups of formula (M), (M') or (M").

When the polymer (P) is a polyethersulfone (PES) copolymer, it can be made of recurring units (R*$_{PESU}$), different from recurring units (R$_{PESU}$), such as recurring units of formula (L-A), (L-B) and/or (L-D), all above-described.

Polyfunctional Acrylate

According to the present invention, the polyfunctional acrylate is a compound especially added to a formulation (F) as a cross-linker, that-is-to-say to create a high molecular weight network with polymer (P) after printing and curing, due to the presence of photocurable groups on polymers (P).

In some embodiments, the polyfunctional acrylate used in the formulation (F) of the present invention is selected from the group consisting of trimethylolpropane triacrylate (TMPTA), trimethylolpropane ethoxytriacrylate, trimethylolpropane propoxytriacrylate, pentaerythritol triacrylate (PETA), glyceryl propoxytriacrylate (GPTA), di(trimethylolpropane) tetraacrylate, glycerol propoxylate triacrylate, pentaerythritol tetraacrylate, 1,3,5-triacryloyl hexahydro-1,3,5-triazine, trimethylolpropane ethoxylate triacrylate, trimethylolpropane ethoxylate triacrylate, trimethylolpropane trimethacrylate, tris[2-(acryloyloxy)ethyl]isocyanurate and mixture thereof.

In some embodiments, the polyfunctional acrylate used in the formulation (F) of the present invention is bio-sourced, for example derived from castor-oil.

The polyfunctional acrylate used in the formulation (F) of the present invention is preferably according to formula (I):

wherein
$R^3$ is H or an alkyl having 1 to 5 carbon atoms, preferably H or $CH_3$,
$R^4$ is according to formula (II):

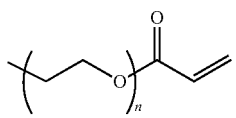

where n varies between 0 and 10, preferably between 0 and 3.

The polyfunctional acrylate cross-linker used in the formulation (F) of the present invention is more preferably according to formula (III):

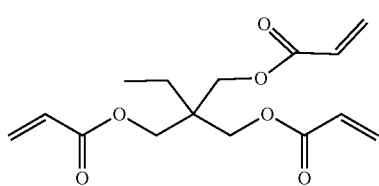

The concentration of the polyfunctional acrylate in the formulation (F) may be at least 0.05 wt. %, for example between 0.05 to 30 wt. %, based on the total weight of the formulation (F), for example between 0.1 and 25 wt. %, between 0.2 and 20 wt. % or between 0.5 and 15 wt. %.

Solvent

The concentration of the solvent may be between 1 to 80 wt. %, based on the total weight of the formulation (F), for example between 2 and 75 wt. %, between 5 and 70 wt. % or between 10 and 65 wt. %.

According to an embodiment of the present invention, the solvent is selected from the group consisting of N-methylpyrrolidone (NMP), N,Ndimethylformamide (DMF), N,N-dimethylacetamide (DMAC), 1,3-dimethyl-2-imidazolidinone (DMI), tetrahydrofuran (THF), dimethyl sulfoxide (DMSO) and sulfolane.

Preferably, the solvent is a dipolar aprotic solvent. Preferably, the solvent is selected from the group consisting of N-methylpyrrolidone (NMP), dimethylacetamide (DMAc or DMA), N-Cyclohexyl-2-pyrrolidone (CHP) and dimethyl sulfoxide (DMSO).

Photoinitiator

In some embodiments, the formulation (F) further comprises a photoinitiator.

A photoinitiator is a compound especially added to a formulation to convert absorbed light energy, UV or visible light, into chemical energy in the form of initiating species, for example free radicals or cations. Based on the mechanism by which initiating radicals are formed, photoinitiators are generally divided into two classes:
  Type I photoinitiators undergo a unimolecular bond cleavage upon irradiation to yield free radicals,
  Type II photoinitiators undergo a bimolecular reaction where the excited state of the photoinitiator interacts with a second molecule (a coinitiator) to generate free radicals.

The concentration of the photoinitiator in the formulation (F) may be between 0.05 to 10 wt. %, based on the total weight of the formulation (F), for example between 0.1 and 5 wt. %, between 0.2 and 4 wt. % or between 0.5 and 3 wt. %.

According to an embodiment of the present invention, the photoinitiator is selected from the group consisting of:
  Acetophenone
  Anisoin
  Anthraquinone
  Anthraquinone-2-sulfonic acid, sodium salt monohydrate
  (Benzene) tricarbonylchromium
  Benzil
  Benzoin
  Benzoin ethyl ether, Benzoin isobutyl ether, Benzoin methyl ether and Benzophenone
  3,3',4,4'-Benzophenonetetracarboxylic dianhydride
  4-Benzoylbiphenyl
  2-Benzyl-2-(dimethylamino)-4'-morpholinobutyrophenone
  4,4'-Bis(diethylamino)benzophenone
  4,4'-Bis(dimethylamino)benzophenone
  Camphorquinone
  2-Chlorothioxanthen-9-one
  (Cumene)cyclopentadienyliron(II) hexafluorophosphate
  Dibenzosuberenone
  2,2-Diethoxyacetophenone
  4,4'-Dihydroxybenzophenone
  2,2-Dimethoxy-2-phenylacetophenone
  4-(Dimethylamino)benzophenone
  4,4'-Dimethylbenzil
  2,5-Dimethylbenzophenone
  3,4-Dimethylbenzophenone
  Diphenyl(2,4,6-trimethylbenzoyl)phosphine oxide, 2-Hydroxy methylpropiophenone and blends (e.g. 50/50 blend)
  4'-Ethoxyacetophenone
  2-Ethylanthraquinone
  Ferrocene
  3'-Hydroxyacetophenone, 4'-Hydroxyacetophenone, 3-Hydroxybenzophenone and 4-Hydroxybenzophenone
  1-Hydroxycyclohexyl phenyl ketone
  2-Hydroxy-2-methylpropiophenone
  2-Methylbenzophenone or 3-Methylbenzophenone
  Methybenzoylformate
  2-Methyl-4'-(methylthio)-2-morpholinopropiophenone
  Phenanthrenequinone
  4'-Phenoxyacetophenone
  Phenylbis(2,4,6-trimethylbenzoyl)phosphine oxide
  Thioxanthen-9-one
  Triarylsulfonium hexafluoroantimonate salts, mixed, 50% in propylene carbonate
  Triarylsulfonium hexafluorophosphate salts, mixed, 50% in propylene carbonate, and
  mixture thereof.

Preferably, the photoinitiator is selected from the group consisting of 2,2-dimethoxy-2-phenylacetophenone (DMPA), Diphenyl(2,4,6-trimethylbenzoyl)phosphine oxide and Phenylbis(2,4,6-trimethylbenzoyl)phosphine oxide.

Blocker

In some embodiments, the formulation (F) further comprises a blocker. A blocker is a compound that is added to the formulation in order to (i) scavenge a predetermined amount of radicals formed by the photoinitiator while irradiated by UV light, (ii) scavenge unused radicals that may be present after the UV irradiation source has been turned off, and/or (iii) absorb a portion of the energy that is delivered to the system during UV irradiation.

The concentration of the blocker in the formulation (F) may be between 0.05 to 10 wt. %, based on the total weight of the formulation (F), for example between 0.1 and 5 wt. %, between 0.2 and 4 wt. % or between 0.5 and 3 wt. %.

According to an embodiment of the present invention, the blocker is selected from the group consisting of:
2-hydroxy-4-methoxy benzophenone (oxybenzene)
1-(4-methoxyphenyl)-3-(4-tert-butylphenyl)propane-1,3-dione (avobenzone)
disodium 2,2'-(1,4-phenylene)bis(6-sulfo-1H-benzimidazole-4-sulfonate) (bisdisulizole disodium)
hexyl 2-[4-(diethylamino)-2-hydroxybenzoyl]benzoate (diethylamino hydroxybenzoyl hexyl benzoate)
menthyl-o-aminobenzoate (menthyl anthranilate)
2,2'-[6-(4-methoxyphenyl)-1,3,5-triazine-2,4-diyl]bis{5-[(2-ethylhexyl)oxy]phenol}(bemotrizinol)
2,4-dihydroxybenzophenone
2,2',4,4'-tetrahydroxybenzophenone
4-Hydroxy-2-methoxy-5-(oxo-phenylmethyl)benzenesulfonic acid (sulisobenzone)
2,2'-dihydroxy-4,4'-dimethoxybenzophenone
5-chloro-2-hydroxybenzophenone
(2-hydroxy-4-methoxyphenyl)-(2-hydroxyphenyl)methanone (dioxybenzone)
2,5-Bis(5-tert-butyl-benzoxazol-2-yl)thiophene
sodium 2,2'-dihydroxy-4,4'-dimethoxybenzophenone-5,5'-disulfonate
(2-hydroxy-4-methoxyphenyl)(4-methylphenyl)methanone (mexenone)
(2-hydroxy-4-octoxy-phenyl)-phenyl-methanone (octabenzone)
2-(1,2,3-Benzotriazol-2-yl)-4-methyl-6-[2-methyl-3-(2,2,4,6,6-pentamethyl-3,5-dioxa-2,4,6-trisilaheptan-4-yl)propyl]phenol (drometrizole trisiloxane)
terephthalylidene dicamphor sulfonic acid (ecamsule)
2-ethylhexyl 2-cyano-3,3-diphenyl-2-propenoate (octocrylene)
diethylhexyl butamido triazone (iscotrizinole)
2-Ethoxyethyl 3-(4-methoxyphenyl)propenoate (cinoxate)
isopentyl 4-methoxycinnamate (amiloxate)
2,2'-methanediylbis[6-(2H-benzotriazol-2-yl)-4-(2,4,4-trimethylpentan-2-yl)phenol](bisoctrizole)
2-(2H-benzotriazol-2-yl)-4-(1,1,3,3-tetramethylbutyl)phenol
2,2'-methylenebis[6-(2H-benzotriazol-2-yl)-4-(1,1,3,3-tetramethylbutyl)phenol]
2-hydroxy-4-(octyloxy)benzophenone
2-ethyl-, 2-[4-(4,6-diphenyl-1,3,5-triazin-2-yl)-3-hydroxyphenoxy]ethyl ester 2-tert-butyl-6-(5-chloro-2H-benzotriazol-2-yl)-4-methylphenol
2-(2-hydroxy-5-methylphenyl)benzotriazole
2,4-dinitrophenylhydrazine
N-(4-ethoxycarbonylphenyl)-N'-methyl-N'-phenylformamidine
hexadecyl 3,5-bis-tert-butyl-4-hydroxybenzoate
2-ethyl-2'-ethoxy-oxalanilide, and
mixture thereof.

Preferably, the blocker is selected from the group consisting of avobenzone and 2,5-Bis(5-tert-butyl-benzoxazol-2-yl)thiophene.

Optional Components

The formulation (F) of the present invention may comprise at least one additive, for example selected from the group consisting of fillers such as silica, antioxidants, antibacterial compounds and antistatic compounds. The additive may for example be a chemically inert species such as carbon black, silica (e.g. microsilica particles) and carbon nano tubes.

Process for Manufacturing a 3D Article

The present invention also relates to a method for manufacturing a 3D article with an additive manufacturing system, comprising:
providing a polymer formulation (F) as above-described,
printing layers of the 3D article from the polymer formulation (F),
optionally, curing the 3D article at a temperature ranging from 50 to 450° C., preferably from 100 to 300° C., even more preferably between 120 and According to an embodiment, the step of printing comprises irradiating the polymer formulation (F), for example a layer of such formulation (F) deposited onto the printing surface, with UV light. The layer preferably presents a size in the range of 5 μm to 300 μm, for example 20 μm to 150 μm.

The UV light can for example be laser light. The irradiation is preferably of sufficient intensity to cause substantial curing of the polymer formulation (F), for example the layer of such formulation (F). Also, the irradiation is preferably of sufficient intensity to cause adhesion of the layers of polymer formulation (F).

According to another embodiment of the present invention, the method for manufacturing a 3D article with an additive manufacturing system, comprises the steps of:
providing a polymer formulation (F) as above-described,
printing layers of the 3D article from the polymer formulation (F) by:
a) coating a layer of the formulation (F) onto a surface,
b) irradiating the layer with UV light, c) coating a layer of the formulation (F) onto the former irradiated layer,
d) irradiating the layer with UV light and
e) repeating steps c) and d) a sufficient number of times to manufacture the 3D article.

According to an embodiment, the polymer formulation (F) is at room temperature during the process. Alternatively, the formulation can be heated before and/or during printing, especially if the polymer concentration in the formulation is high. In this case, the temperature can be heated up to 130° C., up to 120° C. or up to 110° C. before and/or during printing.

Applications

The present invention also relates to the use of the polymer (P) of the present invention or of the polymer formulation (F) of the present invention, for the manufacture of 3D objects/articles.

All of the embodiments described above with respect to the polymer (P) and the polymer formulation (F) do apply equally to the use for the manufacture of 3D objects/articles.

The present invention also relates to 3D objects or 3D articles obtainable, at least in part, from the method of manufacture of the present invention, using the polymer (P) or the polymer formulation (F) herein described.

In some embodiments, the 3D articles of the present invention incorporate at least one ppm of residual acrylates or residual styrenes, as detected by photoacoustic FTIR measurements, for example at least 2 ppm, at least 5 ppm, or at least 10 ppm.

The 3D objects or articles obtainable by such method of manufacture can be used in a variety of final applications. Mention can be made in particular of implantable device, dental prostheses, brackets and complex shaped parts in the aerospace industry and under-the-hood parts in the automotive industry.

Should the disclosure of any patents, patent applications, and publications which are incorporated herein by reference conflict with the description of the present application to the extent that it may render a term unclear, the present description shall take precedence.

The invention will be now described in more detail with reference to the following examples whose purpose is merely illustrative and not limitative of the scope of the invention.

EXAMPLES

Raw Materials

N,N-dimethylacetamide (DMAc) (anhydrous, 99.8%), potassium carbonate ($K_2CO_3$) (anhydrous, >99.0%), Celite® 545 filter agent and sodium bicarbonate ($NaHCO_3$) were purchased from Sigma-Aldrich and used as received. Bisphenol A (BPA, >99%), trimethylolpropane triacrylate (TPM, contains 600 ppm monomethyl ether hydroquinone as inhibitor), acryloyl chloride (>97%, contains 400 ppm of phenothiazine as stabilizer), and 4,4'-dichlorophenyl sulfone (DCPS) were purchased from Aldrich and used as received. Hydrochloric acid, chloroform (HPLC grade), toluene, sodium chloride, methanol, and tetrahydrofuran were purchased from Fisher Chemical and used as received. Diphenyl(2,4,6-trimethylbenzoyl) phosphine oxide (>98%) was purchased from TCI as used as received.

Chloroform-d ($CDCl_3$) (99.8% atom D) were purchased from Cambridge Isotope Labs and used as received. N-methylpyrrolidone (NMP, BioSolv) and N,N-dimethylformamide (spectrophotometric grade) were purchased from Spectrum and used as received. Triethylamine was purchased from Acros Organics, stirred over calcium hydride (Sigma-Aldrich, 95%) overnight, and then distilled at 90° C. prior to use.

Example 1—Synthesis of Polysulfones Polymers

Three acrylate-terminated PSU polymers (comparative and inventive) were prepared via a two-step procedure according to Table 1. In step 1, the phenol-terminated PSU polymers were prepared and characterized, as shown in Scheme 1 below. In step 2, the phenol-terminated PSU polymers were converted to the corresponding acrylate-terminated PSU polymers, as shown in Scheme 2 below. The polymers were then characterized by DSC and TGA as detailed below. Results are presented in Table 2 below.

TABLE 1

| Examples | Target Mn (g/mol) |
| --- | --- |
| P1 - Acrylate-terminated PSU | 6,000 |
| P2 - Acrylate-terminated PSU | 10,000 |
| P3 - Acrylate-terminated PSU | 20,000 |

Scheme 1 (Synthesis of PSU polymers - Step 1)

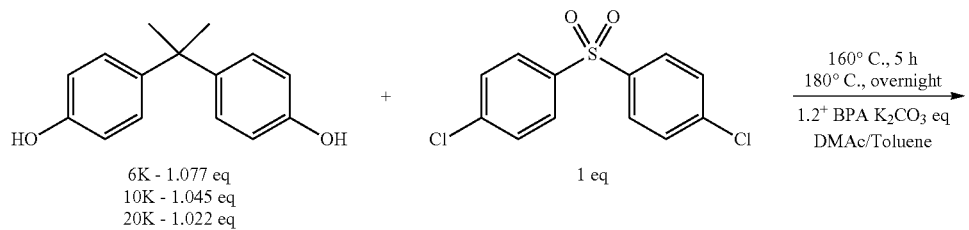

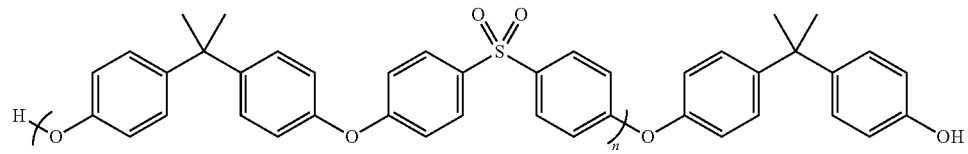

Scheme 2 (Synthesis of PSU polymers - Step 1)

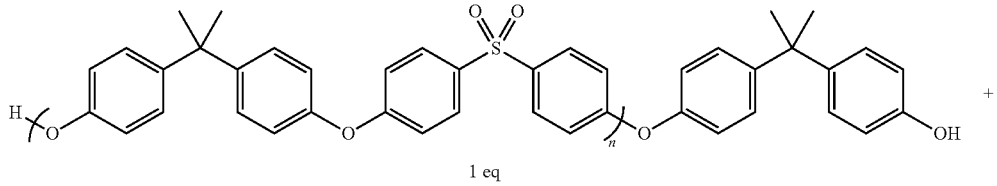

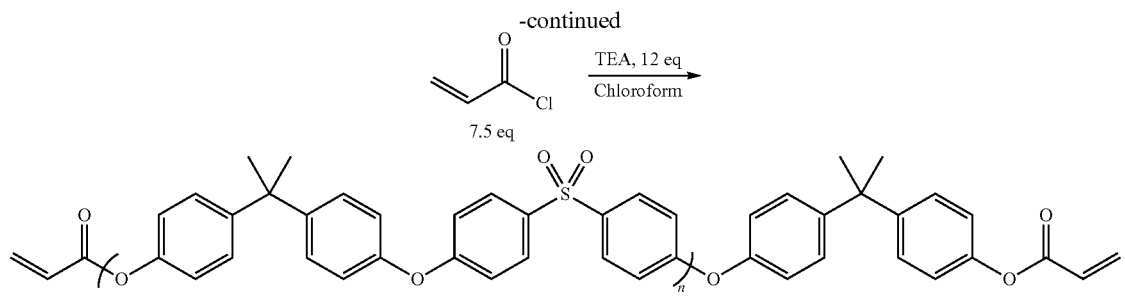

Step 1: Preparation of a Phenol-Terminated PSU Polymers of Mn=20,000 g/Mol

BPA (52.74 g, 0.2310 mol), DCPS (64.89 g, 0.2260 mol), and potassium carbonate (38.32, 0.2772 mol) were dispersed into anhydrous N,N-dimethylacetamide (400 mL), and toluene (200 mL) within a three-neck, round-bottomed flask fitted with a nitrogen adapter, Dean-Stark trap with a condenser, and a glass mechanical stir rod with a Teflon™ paddle. The heterogenous solution was purged with $N_2$ for 20 minutes and subsequently heated to 160° C. at which point the reaction was left to reflux for 5 h. The toluene/water azeotrope produced was then drained, and the polymerization was further heated to 180° C. for 12 h, cooled to room temperature, and the resulting solution was filtered through a Celite® to remove salts produced during the course of the polymerization. To protonated the phenol chain ends, the solution was then neutralized using 1 M HCl solution in THF, and final 20,000 Mn PSU polymer was isolated via precipitation into 4 L of MeOH. The resulting white powder was dried in vacuo at 200° C. for 18 h. GPC was used to determine molecular weight.

Step 2: Preparation of Acrylate-Terminated PSU Polymers of Mn=20,000 g/Mol

The phenol-terminated PSU polymer (60.00 g, 0.003 mol) obtained in step 1 was weighed into a single-neck, round-bottom flask with chloroform (200 mL) and a magnetic stir bar. The resulting solution was then sparged with $N_2$ for 20 minutes, and triethylamine (5.735 mL, 0.041 mol) was added dropwise at which point the solution was cooled to 0° C. using an ice bath. Acryloyl chloride (2.078 mL, 0.026 mol) was added dropwise to the stirred solution. Upon complete addition, the reaction was allowed to stir at 0° C. for 20 minutes, and then heated to 23° C. where it was allowed to stir for an additional 12 h. The final product was isolated by washing with 2 M aqueous HCl, separating the layers, stirring the organic layer over basic alumina for 1 h followed by washing with 1 M NaOH, sodium bicarbonate solution, and again with brine, 3 times each and drying over $MgSO_4$ for 2 h followed by precipitation into MeOH to afford a white powder was then dried in vacuo at 50° C. overnight. End group conversion of the phenol chain ends was confirmed by monitoring the peak shifts by $^1$H NMR. This was done by locating the three peaks that are characteristic of an acrylate at 6.00, 6.31, and 6.59 ppm. In this case, the four benzylic protons used to track the end group previously have shifted and now only two protons are visible so those two are used rather than the four used previously. These two protons do also lie partially under a backbone aromatic peak, which causes the integration to be higher causing an artificially low integration value for the acrylate peaks.

Characterization of the PSU Polymers

Gpc 20 mg of PSU was dissolved in 20 mL of chloroform to produce a 1 mg/mL sample. The solution was filtered through a 450 nm PTFE filter into a 1 cm path length quartz cuvette. Dynamic light scattering (DLS) using a Malvern Zetasizer Nano ZS confirmed single chain dissolution in chloroform with no aggregation. The sample was then eluted on Acquity APC XT Columns in a Waters Acquity Advanced Polymer Chromatography system with a 1 mL/min flow rate. The Mn from refractive index was determined by comparison with polystyrene standards at 35° C.

DSC

Differential scanning calorimetry with a TA instruments Q1000 elucidated the glass transition temperatures ($T_g$) with heat/cool/heat cycles at 20/5/20° C./min, respectively. The $T_g$ was taken from the inflection point on the second heat cycle.

TGA

Thermogravimetric analysis was performed on a TA Instruments Q50 with $N_2$ fill gas with a temperature ramp of 10° C./min from 25° C. to 800° C.

TABLE 2

| Examples | Target Mn (g/mol) | Measured Mn (g/mol) | Tg (° C.) | $T_{d, 5\%}$ (° C.) |
|---|---|---|---|---|
| P1 | 6,000 | 5,700 | 172 | 465 |
| P2 | 10,000 | 9,300 | 179 | 459 |
| P3 | 20,000 | 14,600 | 188 | 505 |

Example 2—Formulations Prepared for Photorheology

Several formulations were prepared according to Table 3 below. 0.36 g of PSU polymers were weighed into 2-dram vials with 0.84 g of NMP. The solutions were mixed with a VWR mini-vortexer until a homogenous solution was achieved. 9 mg of diphenyl(2,4,6-trimethylbenzoyl) phosphine oxide (photo-initiator) was added to the solution, as well as TMP (polyfunctional acrylate), the vial covered with aluminum foil, and allowed to mix overnight on a VWR standard analog shaker table. The samples were used within 24 h.

TABLE 3

| Formulations used in Photorheology Assessment | | | | |
|---|---|---|---|---|
| Formulation | Polymer (g, wt %) | Trifunctional Acrylate (g, wt %) | Photo-initiator (g, wt %) | Solvent (g, wt %) |
| CE1 | P1 - 0.36, 30 | 0 | 0.0092, 2.5 | 0.84, 70 |
| CE2 | P2 - 0.36, 30 | 0 | 0.0092, 2.5 | 0.84, 70 |

TABLE 3-continued

Formulations used in Photorheology Assessment

| Formulation | Polymer (g, wt %) | Trifunctional Acrylate (g, wt %) | Photo-initiator (g, wt %) | Solvent (g, wt %) |
|---|---|---|---|---|
| CE3 | P3 - 0.36, 30 | 0 | 0.0092, 2.5 | 0.84, 70 |
| E4 | P3 - 0.288, 24 | 0.072, 6 | 0.0092, 2.5 | 0.84, 70 |
| E5 | P3 - 0.324, 27 | 0.036, 3 | 0.0092, 2.5 | 0.84, 70 |
| E6 | P3 - 0.342, 28.5 | 0.018, 1.5 | 0.0092, 2.5 | 0.84, 70 |
| E7 | P3 - 0.351, 29.25 | 0.009, 0.75 | 0.0092, 2.5 | 0.84, 70 |

Photorheology Experiments: To determine the suitability of a particular formulation for printability, a series photorheology experiments were carried out. For a solution to be processable via vat photo-polymerization a modulus above 30,000 Pa and a G'/G' crossover time under 2 s is desirable. Photo-rheological experiments were performed on a TA Instruments DHR-2 at 25° C. These measurements were made on a Smart Swap™ geometry with an Omnicure S2000 high-pressure mercury light source with a 320-500 nm filter, 20 mm disposable aluminum parallel plate, and a 20 mm quartz parallel plate lower geometry with a 1000 µm gap. UV intensity was measured using a Silverline radiometer with a 20 mm attachment. Measurement parameters were set with a sampling frequency of 1 Hz, 0.1% strain, and 250 mW/cm$^2$ UV light intensity. The samples were exposed to UV light 30 s into the experiment for 15 s. The data was analyzed using the TA Instruments TRIOS software to identify the storage modulus (G'), loss modulus (G"), and crossover time.

Table 4 shows how the molecular weight (Mn) of the polymer affects the printability based on photorheology when the formulations comprise just the polymer and a photo-initiator. While polymers of molecular weight lower than 12,000 g/mol show storage modulus which makes them printable, the polymer of comparative example 3 having a molecular weight of 20,000 g/mol has a too low modulus to a point where it is not printable.

TABLE 4

Results of printability assessment made using photorheology for formulations of varying molecular weight without trifunctional acrylate.

| Examples | Mn (g/mol) | Storage Modulus (Pa) | Crossover Time (s) | Printability |
|---|---|---|---|---|
| CE1 | 5,700 | 82,000 Pa | 1.76 s | Yes |
| CE2 | 9,300 | 45,000 Pa | 1.74 s | Yes |
| CE3 | 14,600 | 18,000 Pa | 1.51 s | No |

Table 5 shows that adding a trifunctional acrylate makes it possible to obtain high enough modulus to print parts based on photo-rheology for an acrylate-functionalized polysulfone polymer of Mn=20,000 g/mol. It also shows a meaningful improvement in the crossover time.

TABLE 5

Results of printability assessment made using photorheology for high Mn formulations with trifunctional acrylate

| Examples | Mn (g/mol) | Wt. % TMP | Storage Modulus (Pa) | Crossover Time (s) | Printability |
|---|---|---|---|---|---|
| CE3 | 14,600 | 0 | 18,000 | 1.51 | No |
| E4 | 14,600 | 2.5 | 31,000 | 1.23 | Yes |
| E5 | 14,600 | 5 | 37,000 | 1.23 | Yes |
| E6 | 14,600 | 10 | 56,000 | 1.20 | Yes |
| E7 | 14,600 | 20 | 280,000 | 1.39 | Yes |

Example 3—Formulations Used in Vat Photopolymerization

A formulation according to the invention was prepared by dissolving the polymer P3 (27.552 g, 23.85 wt %), the TMP (6.888 g, 5.96 wt %), diphenyl(2,4,6-trimethylbenzoyl) phosphine oxide photo-initiator (0.706 g, 0.612 wt %), into NMP (80.36 g, 69.57%).

A part was fabricated with a laser-based VP apparatus.

Laser-Based VP Apparatus:

A 405 nm UV laser and optical train was extracted from Formlabs 1+ and used for delivering UV irradiation to the resin surface. An aluminum vat was used to contain the resin during the printing process. A stainless steel build stage with glass build platform was used as the stage for part fabrication. A stainless-steel rotary recoating system was used to recoat resin on the build platform.

Printing Method 65 ml of the formulation was transferred into the aluminum vat and the build platform was located at the focal plane of the projector. After a brief dipping step, the build platform was positioned at a depth of 1-layer thickness from the resin surface. The rotary recoating blade was then used to smoothen the resin surface and from a meniscus-free later. A pattern corresponding to the layer-to-be-fabricated was rastered on the resin surface at a predetermined number of passes, laser power, and scan-speed. These steps were repeated until part completion.

PreForm 2.3.3 was used to slice the STL file into 120 micron layers. A custom Python program was used to control the apparatus and printing process.

A hexagonal open lattice with a pillar wall thickness of 750 microns, side walls of size 2 mm height of 24 mm, width of 17 mm and length of 28 mm was constructed in Netfabb and extruded to a height of 24 mm to create the reference geometry.

Printing Results

Printing Parameters:
  Layer thickness=120 microns
  Intensity=20 mW
  Scan Speed=1550 mm/s
  # of passes per layer=1
  Feature Resolution: Hexagonal walls were visible on the part height. Average wall thickness was around 2 mm.

Addition of TMP increased the modulus of the cured gel, thus forming a self-supporting structure faster than a TMP-free formulation.

The invention claimed is:

1. A polymer formulation (F) comprising, based on the total weight of the formulation (F):
   from 1 to 50 wt. %, based on the total weight of F, of at least one poly(aryl ethersulfone) (PAES) polymer (P) comprising at least one terminal group of formula (M1) or (M2):

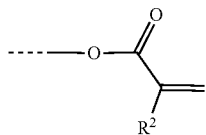

(M1)

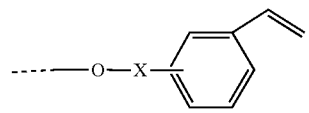

(M2)

wherein

R² is H or CH₃,

X is a bond or (CH₂)n with n ranging from 1 to 20, and wherein the number average molecular weight (Mn) of the polymer (P) is of more than 12,000 g/mol, as determined by gel permeation chromatography (GPC) using methylene chloride as a mobile phase and polystyrene standards, at least one polyfunctional acrylate, at least one solvent, optionally at least one photoinitiator, and optionally at least one blocker, wherein wherein the polyfunctional acrylate is according to formula (I):

(I)

wherein

R³ is H or an alkyl having 1 to 5 carbon atoms,

R⁴ is according to formula (II):

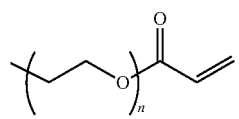

(II)

where n varies between 0 and 10; or wherein the polyfunctional acrylate is selected from the group consisting of trimethylolpropane propoxytriacrylate, pentaerythritol triacrylate (PETA), glyceryl propoxytriacrylate (GPTA), di(trimethylolpropane) tetraacrylate, glycerol propoxylate triacrylate, pentaerythritol tetraacrylate, 1,3,5-triacryloylhexahydro-1,3,5-triazine, trimethylolpropane trimethacrylate, tris[2-(acryloyloxy)ethyl]isocyanurate, and mixtures thereof.

2. The formulation (F) of claim 1, wherein P is a PAES comprising recurring units ($R_{PAES}$) of formula (L):

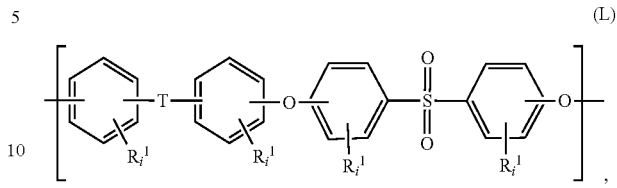

(L)

each $R^1$ is, independently for each aromatic cycle, selected from the group consisting of a halogen, alkyl, alkenyl, alkynyl, aryl, ether, thioether, carboxylic acid, ester, amide, imide, alkali or alkaline earth metal sulfonate, alkyl sulfonate, alkali or alkaline earth metal phosphonate, alkyl phosphonate, amine and quaternary ammonium;

each i is, independently for each aromatic cycle, zero or an integer from 1 to 4;

T is selected from the group consisting of a bond, —CH₂—; —O—; —SO₂—; —S—; —C(O)—; —C(CH₃)₂—; —C(CF₃)₂—; —C(=CCl₂)—; —C(CH₃)(CH₂CH₂COOH)—; —N=N—; —R$_a$C=CR$_b$—, where each R$_a$ and R$_b$, independently from each other, is a hydrogen, a C1-C12-alkyl group, a C1-C12-alkoxy group, a C6-C18-aryl group; —(CH₂)$_m$ and —(CF₂)$_m$ with m being an integer from 1 to 6; an aliphatic divalent group, linear or branched, of up to 6 carbon atoms; or a combination thereof.

3. The formulation (F) of claim 2, wherein T is selected from the group consisting of a bond, —SO₂— and —C(CH₃)₂—.

4. The formulation (F) of claim 2, wherein the PAES polymer comprises at least 50 mol. % (based on the total number of moles in the polymer) of recurring units of formula (L).

5. The formulation (F) of claim 2, wherein the PAES polymer comprises at least 50 mol. % (based on the total number of moles in the polymer) of recurring units selected from the group consisting of formulas:

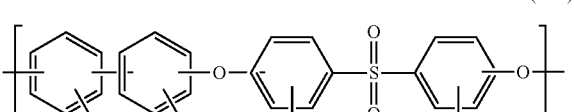

(L-A)

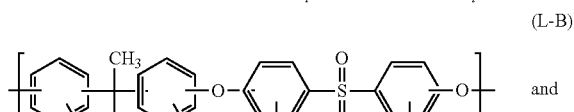

(L-B)

and

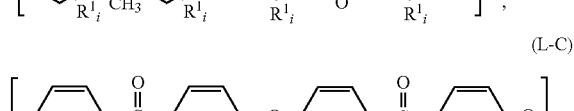

(L-C)

wherein $R^1$ is independently for each aromatic cycle, selected from the group consisting of a halogen, alkyl, alkenyl, alkynyl, aryl, ether, thioether, carboxylic acid, ester, amide, imide, alkali or alkaline earth metal sulfonate, alkyl sulfonate, alkali or alkaline earth metal phosphonate, alkyl phosphonate, amine and quaternary ammonium and i is independently for each aromatic cycle, zero or an integer from 1 to 4.

6. The formulation (F) of claim 1, comprising at least 0.05 wt. % of polyfunctional acrylate, based on the total weight of the formulation (F).

7. The formulation (F) of claim 1, wherein the polyfunctional acrylate is according to formula (III):

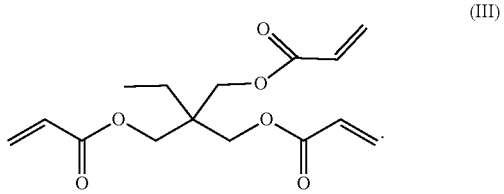 [SMILES: C=CC(=O)OCC(CC)(COC(=O)C=C)COC(=O)C=C]

(III)

8. The formulation (F) of claim 1, wherein:
the solvent is selected from the group consisting of N-methylpyrrolidone (NMP), N,N-dimethylformamide (DMF), N,N-dimethylacetamide (DMAC), 1,3-dimethyl-2-imidazolidinone (DMI), tetrahydrofuran (THF), dimethyl sulfoxide (DMSO) and sulfolane,
the photoinitiator is selected from the group consisting of 2,2-dimethoxy-2-phenylacetophenone (DMPA), Diphenyl(2,4,6-trimethylbenzoyl)phosphine oxide and phenylbis(2,4,6-trimethylbenzoyl)phosphine oxide, and/or
the blocker is selected from the group consisting of avobenzone and 2,5-Bis(5-tert-butyl-benzoxazol-2-yl)thiophene.

9. A method for manufacturing a 3D article with an additive manufacturing system, comprising:
providing a polymer formulation (F) according to claim 1, and
printing layers of the 3D article from the polymer formulation (F), and
optionally, curing the 3D article at a temperature ranging from 50 to 450° C.

10. The method of claim 9, wherein the step of printing comprises irradiating the polymer formulation (F) with light.

11. A 3D article obtainable, at least in part, by the method of claim 9.

12. A method of manufacturing 3D objects, wherein the method comprises printing the polymer formulation (F) of claim 1, alone or in combination with other components, and wherein the printing comprises stereolithography (SLA), direct ink writing (DIW), digital light processing (DLP), or inkjet process.

13. A method of coating an article, the method comprising coating or printing the polymer formulation (F) of claim 1, alone or in combination with other components.

14. The formulation (F) of claim 1, wherein $R^3$ is H or $CH_3$.

15. The formulation (F) of claim 1, wherein n is between 0 and 3.

16. The method of claim 1, wherein the step of printing comprises irradiating the polymer formulation (F) with UV light or visible light.

17. The formulation (F) of claim 1, wherein the polyfunctional acrylate is selected from the group consisting of trimethylolpropane triacrylate (TMPTA), trimethylolpropane ethoxytriacrylate, trimethylolpropane propoxytriacrylate, pentaerythritol triacrylate (PETA), glyceryl propoxytriacrylate (GPTA), di(trimethylolpropane) tetraacrylate, glycerol propoxylate triacrylate, pentaerythritol tetraacrylate, 1,3,5-triacryloylhexahydro-1,3,5-triazine, trimethylolpropane ethoxylate triacrylate, trimethylolpropane ethoxylate triacrylate, trimethylolpropane trimethacrylate, tris[2-(acryloyloxy)ethyl]isocyanurate, and mixtures thereof.

* * * * *